(12) United States Patent
Li

(10) Patent No.: US 10,079,612 B1
(45) Date of Patent: Sep. 18, 2018

(54) DISTRIBUTED ERASURE CODING POOL DEPLOYED IN HYPERSCALE INFRASTRUCTURE

(71) Applicant: Alibaba Group Holding Limited, George Town (KY)

(72) Inventor: Shu Li, Bothell, WA (US)

(73) Assignee: Alibaba Group Holding Limited (KY)

( * ) Notice: Subject to any disclaimer, the term of this patent is extended or adjusted under 35 U.S.C. 154(b) by 0 days.

(21) Appl. No.: 15/459,333

(22) Filed: Mar. 15, 2017

(51) Int. Cl.
*G11C 29/00* (2006.01)
*H03M 13/15* (2006.01)
*G06F 11/10* (2006.01)

(52) U.S. Cl.
CPC ....... *H03M 13/154* (2013.01); *G06F 11/1076* (2013.01)

(58) Field of Classification Search
CPC .......................... H03M 13/154; G06F 11/1076
See application file for complete search history.

(56) References Cited

U.S. PATENT DOCUMENTS

| | | | |
|---|---|---|---|
| 6,021,463 A | 2/2000 | Belser | |
| 6,357,030 B1 | 3/2002 | Demura | |
| 7,937,421 B2 | 5/2011 | Mikesell | |
| 8,015,440 B2 | 9/2011 | Flynn | |
| 2005/0141312 A1 | 6/2005 | Sinclair | |
| 2014/0351508 A1* | 11/2014 | Aliev | G06F 3/0619 |
| | | | 711/114 |

* cited by examiner

*Primary Examiner* — Sam Rizk
(74) *Attorney, Agent, or Firm* — Van Pelt, Yi & James LLP

(57) ABSTRACT

A request associated with modifying the original data to be new data is received. A difference between the original data and the new data is determined. Erasure coding is performed using the difference between the original data and the new data to obtain a parity difference. The original parity is updated using the parity difference.

19 Claims, 7 Drawing Sheets

DISTRIBUTED ERASURE CODING POOL DEPLOYED IN HYPERSCALE INFRASTRUCTURE

BACKGROUND OF THE INVENTION

Companies which need to store and manage large amounts of data often choose to use Hyperscale storage systems. Hyperscale storage systems are desirable because they scale out relatively easily. A typical Hyperscale system includes hundreds of data centers, each of which may have thousands of physical servers which are connected via high-speed network. In other words, Hyperscale systems are distributed storage systems. Some Hyperscale systems store multiple copies to provide data protection. To improve utilization, some Hyperscale systems are moving from redundancy-based protection (e.g., where multiple copies are stored) to erasure codes which consume much less overhead space. With the introduction of erasure codes, new and/or even more efficient techniques which work with erasure codes would be desirable.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
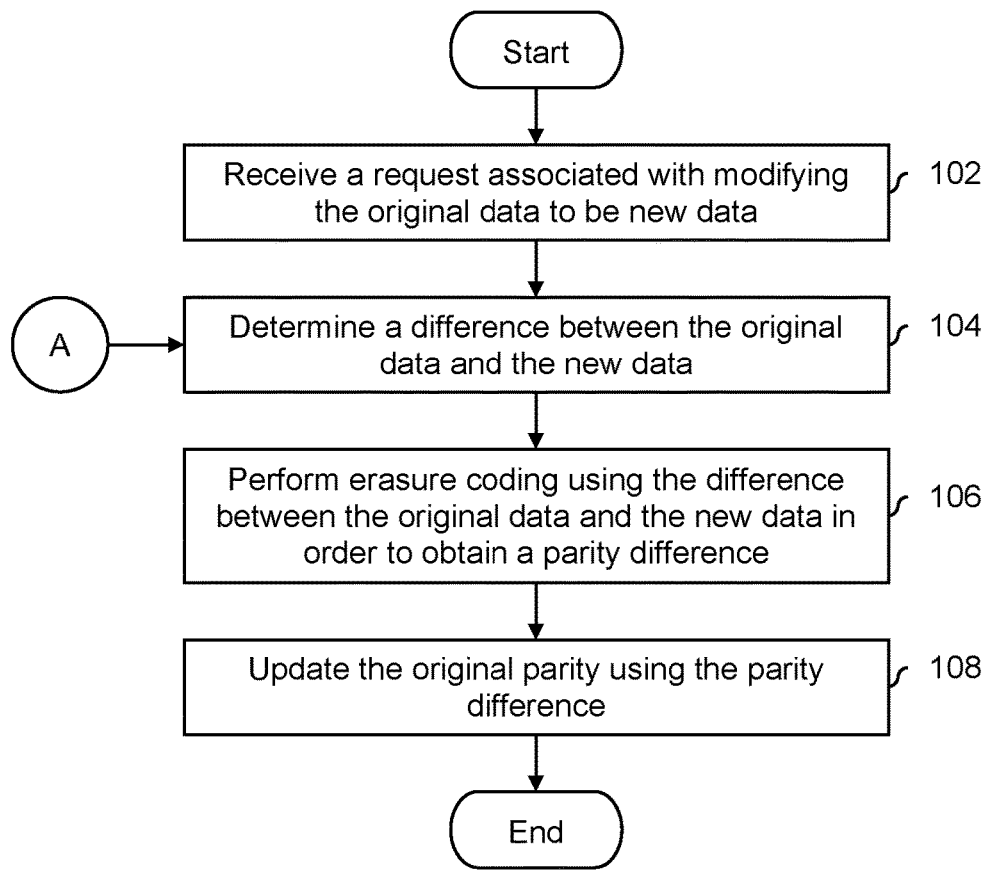
FIG. 1 is a flowchart illustrating an embodiment of a process to update stored and encoded data.

FIG. 1 is a flowchart illustrating an embodiment of a process to update stored and encoded data. In some embodiments, the process is performed by a primary drive in a distributed storage system. For example, the primary drive may interface with and/or receive instructions from an upper-level application or other entity, including instructions to update portions of previously-stored data which are protected using an erasure code.

In the example shown, an update to stored data (i.e., already on storage) is performed. As such, before the process of FIG. 1 is performed, erasure coded information, including original data and original parity, are stored on storage. For example, with systematic codes, the encoded information includes the payload data along with parity information. A variety of erasure codes may be used to generate the erasure coded results, such as Reed-Solomon codes, maximum distance separable codes, etc. In some embodiments, the erasure coded information is stored across multiple devices (e.g., in a distributed storage system). For example, the payload data may be spread out over multiple storage devices and/or the parity information may be spread out over multiple storage devices.

At 102, a request associated with modifying the original data to be new data is received. In some embodiments, the request identifies a specific part or location within the (e.g., overall) original data to be modified. For example, the original data may be relatively large (e.g., on the order of megabytes) and the request may be directly to only a small part of the original data (e.g., on the order of kilobytes). The request may identify a specific (e.g., bit or character) location or offset within the original data that is affected by the request.

At 104, a difference between the original data and the new data is determined. Some examples are described below where the difference is determined in a manner that minimizes (e.g., network) resources in a distributed storage system.

At 106, erasure coding is performed using the difference between the original data and the new data in order to obtain a parity difference. As will be described in more detail below, the parity difference generated at step 106 is not a parity which directly corresponds to the new (e.g., full-length) data. To put it another way, if the new data were input to the encoder, the parity difference would not be output. Rather, the parity difference describes the difference or changes which, when applied to the original parity, would result in the new parity which directly corresponds to the new data in its entirety (e.g., including any unchanged payload data).

At 108, the original parity is updated using the parity difference. As will be described in more detail below, in some embodiments, updating includes dividing up the parity difference into smaller portions and sending those smaller portions of the parity difference over a network to appropriate storage devices in a distributed storage system.

Mathematically, the technique works because of the following properties and/or observations. $C_1$ and $C_2$ (below) are two codewords of an erasure code. H is the parity check matrix of this code. As is shown in the equations below, since $C_1$ and $C_2$ both satisfy H to make its syndrome zero, the bit-wise addition of $C_1$ and $C_2$ will also satisfy the parity check. This means that the incremental value $\Delta C = C_1 + C_2$ is also a codeword of erasure code.

$$C_1 = [c_{11} \ \ldots \ c_{1n}],$$
$$C_2 = [c_{21} \ \ldots \ c_{2n}], \text{ and}$$
$$H = \begin{bmatrix} h_{11} & \ldots & h_{1n} \\ \vdots & \ddots & \vdots \\ h_{p1} & \ldots & h_{pn} \end{bmatrix}.$$

$$\therefore \begin{bmatrix} h_{11} & \ldots & h_{1n} \\ \vdots & \ddots & \vdots \\ h_{p1} & \ldots & h_{pn} \end{bmatrix} \cdot [c_{11} \ \ldots \ c_{1n}]^T = \begin{bmatrix} 0 \\ \vdots \\ 0 \end{bmatrix}$$

and $$\begin{bmatrix} h_{11} & \ldots & h_{1n} \\ \vdots & \ddots & \vdots \\ h_{p1} & \ldots & h_{pn} \end{bmatrix} \cdot [c_{21} \ \ldots \ c_{2n}]^T = \begin{bmatrix} 0 \\ \vdots \\ 0 \end{bmatrix},$$

$$\therefore \begin{bmatrix} h_{11} & \ldots & h_{1n} \\ \vdots & \ddots & \vdots \\ h_{p1} & \ldots & h_{pn} \end{bmatrix} \cdot [(c_{11}+c_{21}) \ \ldots \ (c_{1n}+c_{2n})]^T = \begin{bmatrix} 0 \\ \vdots \\ 0 \end{bmatrix}.$$

$$\Rightarrow \Delta C = C_1 + C_2 = [(c_{11}+c_{21}) \ \ldots \ (c_{1n}+c_{2n})]$$

$$\Rightarrow H \cdot \Delta C = 0$$

The following figure describes an example of data which goes through the process of FIG. 1.

Figure 2:
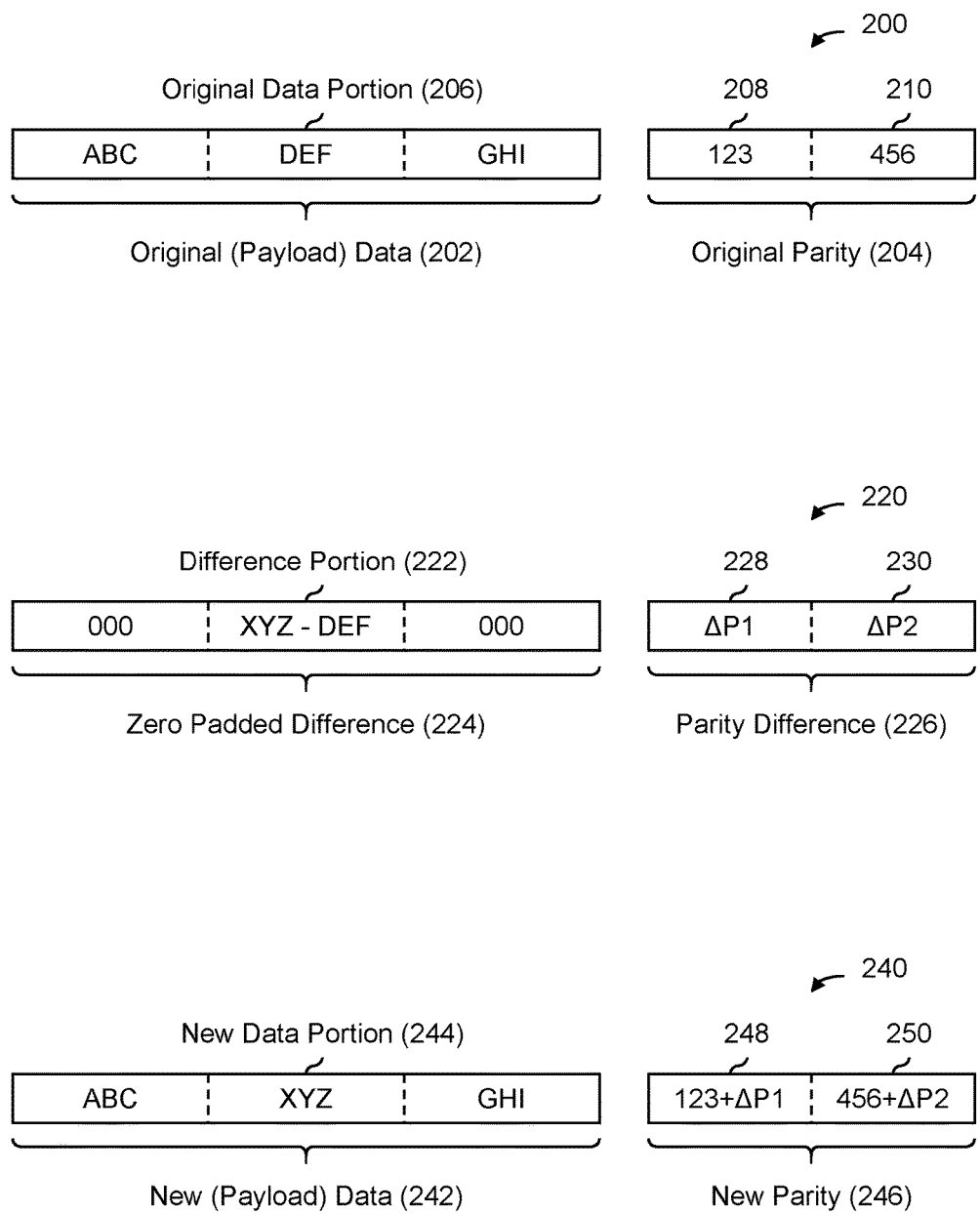
FIG. 2 is a diagram illustrating an embodiment of encoded data which is updated.

FIG. 2 is a diagram illustrating an embodiment of encoded data which is updated. In this example, exemplary data which goes through the process of FIG. 1 is described.

Diagram 200 shows the exemplary data at a first point in time. Original (payload) data (202) includes three portions (e.g., demarcated by dashed lines) which are respectively stored on three different storage devices (not shown here). The original data (202) is input to an erasure encoder (not shown) which implements an erasure code such as Reed-Solomon and generates an original parity (204) based on the original data (202). The original parity includes two portions (again demarcated by dashed lines) which are stored respectively on two different storage devices (not shown here). The original parity information is used to verify that there is no error in the read-back version of the original data and (if needed and within the error correction capabilities of the code) correct any errors in the read-back version of the original data. For example, while stored on storage media, the original data may become corrupted (e.g., a write head in hard disk drive (HDD) storage drifts too close to an adjacent track and partially overwrote the original data stored on the adjacent track) or may decay (e.g., a solid state drive (SSD) near its end of life will have cells with poor electrical insulation, so charge stored thereon leaks out).

In this example, a change is made to the middle portion of the original data, referred to as the original data portion (206). The original data portion with a value of DEF is to be changed to a value of XYZ. In some embodiments, a modification request includes or otherwise identifies an offset or location to be modified within the original data (e.g., modify the second portion, modify bit/character locations 4-6, etc.) and the new data value or portion to be written to that offset of location (in this example, XYZ).

Diagram 220 shows difference portion 222, which in this example is the difference between the new data portion (i.e., the value XYZ) and the original data portion (i.e., the value DEF). The difference portion (222) is zero padded to produce the zero padded difference (224). The zero pads are inserted at locations (e.g., before and/or after the difference portion) so that the difference portion (222) lines up with or matches the part of the original data which is to be modified (i.e., original data portion 206). In this example, three zeros are inserted before and after the difference portion to produce the zero padded difference.

The zero padded difference (224) is fed into an erasure encoder (not shown), which produces the parity difference (226). In this example, the parity difference is shown as two halves: $\Delta P1$ (228) and $\Delta P2$ (230). For example, $\Delta P1$ (228) may comprise the bits or characters in the first half of the parity difference (226) and $\Delta P2$ (230) may comprise the bits or characters in the second half of the parity difference (226).

Diagram 240 shows the new data and new parity after all changes and updates. The new (payload) data (242) includes the new data portion (244) with the new value of XYZ. The first part and last part of the new data remain the same (i.e., with values of ABC and GHI, respectively).

The new parity (246) is a combination of the original parity (204) and the parity difference (226). More specifically, the first part of the new parity (248) has a value of 123+$\Delta P1$ (i.e., the first part of the original parity (208) is bit-wise XORed with the first part of the parity difference (228)) and the second part of the new parity (250) has a value of 456+$\Delta P2$ (i.e., the second part of the original parity (210) is bit-wise XORed with the second part of the parity difference (230)). As will be described in more detail below, in some embodiments, $\Delta P1$ and $\Delta P2$ are sent (e.g., over a network, from a primary drive in a distributed storage system) to respective storage devices which store corresponding portions of the original parity).

The following figure shows an example of a distributed storage system which stores the exemplary data shown here.

Figure 3:
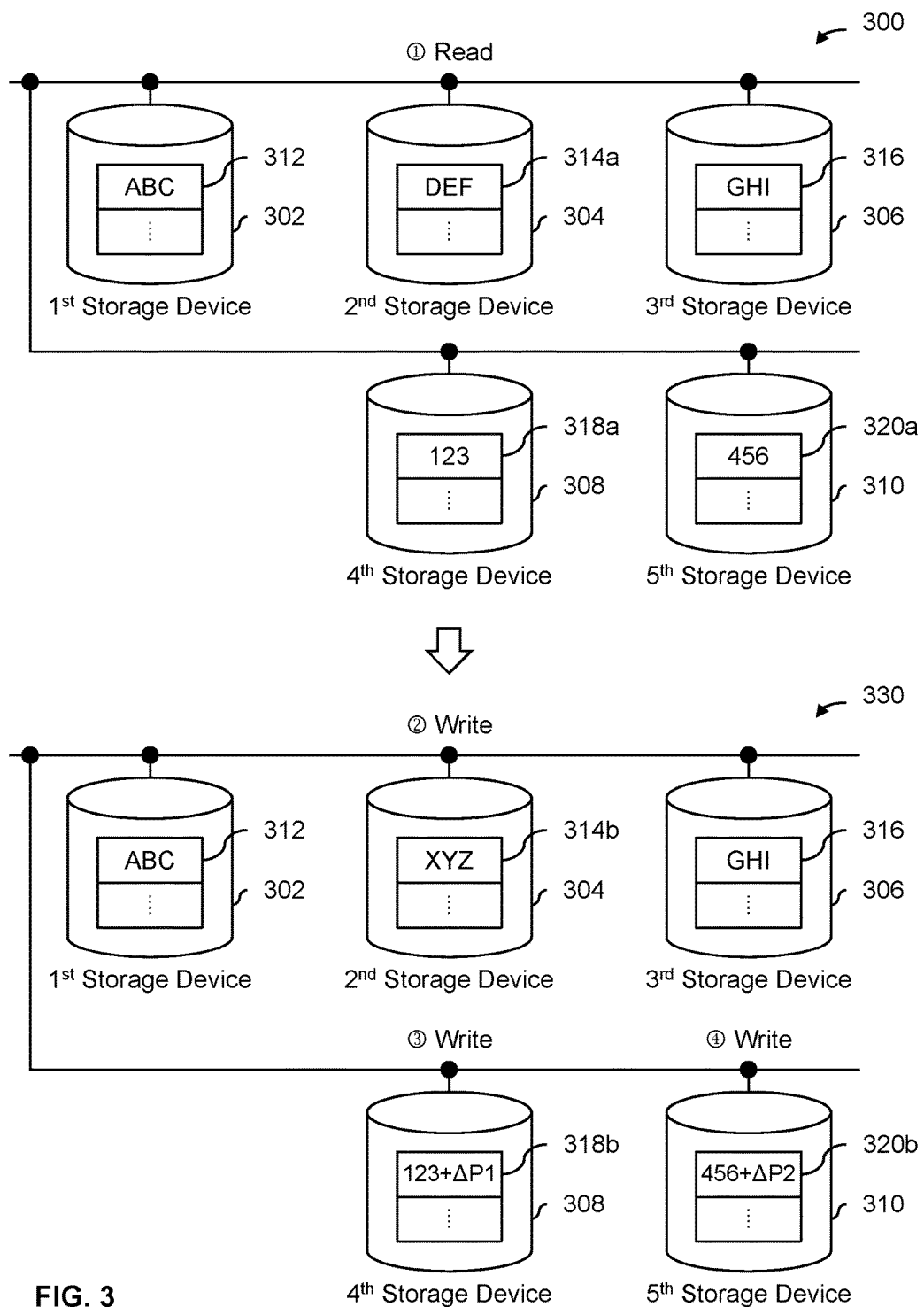
FIG. 3 is a diagram illustrating an embodiment of a distributed storage system in which encoded data is updated.

FIG. 3 is a diagram illustrating an embodiment of a distributed storage system in which encoded data is updated. FIG. 3 continues the example of FIG. 2 and shows an exemplary distributed storage system in which the exemplary data from FIG. 2 may be stored.

Diagram 300 shows the distributed storage system before the update is performed (e.g., corresponding to the state shown in diagram 200 in FIG. 2). As described above, the original (payload) data is divided up into three parts with values of ABC (312), DEF (314a), and GHI (316) which are stored respectively on a first storage device (302), a second storage device (304), and a third storage device (306). Similarly, the original parity information is divided up into two parts with values of 123 (318a) and 456 (320a) which are stored respectively on a fourth storage device (308) and a fifth storage device (310). In some embodiments, a given storage device either stores only payload data or only parity information, but not both. In some embodiments, a storage device is permitted to store some combination of payload data and parity information.

In diagram 300, the original data portion (314a) is read from storage device 304 to obtain the value of DEF. For example, in FIG. 1, this read-back value of DEF may be used to determine the difference between the original data and new data at step 104. See also diagram 220 in FIG. 2 where the read-back value of DEF is used to obtain the difference portion 222. The new data portion (with a value of XYZ in this example) may obtained from the update or modification request (e.g., received at step 102 in FIG. 1). As shown in diagram 220, the difference portion (222) may then be zero padded to obtain the zero padded difference (224) which is input to an encoder to obtain parity difference 226.

Returning to FIG. 3, diagram 330 shows the distributed storage system after the appropriate updates to the payload data and parity have been made (e.g., corresponding to the state shown in diagram 240 in FIG. 2). To update the parity, the first half of the parity difference (i.e., with a value of ΔP1) is combined with the first half of the original parity (with a value of 123 (318a)) to obtain the first half of the new parity (i.e., 123+ΔP1 (318b)). Similarly, the second half of the parity difference (i.e., with a value of ΔP2) is combined with the second half of the original parity (i.e., with a value of 456 (320a)) to obtain the second half of the new parity (i.e., 456+ΔP2 (320b)).

As shown, getting to this stage requires four accesses to the distributed storage system: a read of the second storage device (304) in diagram 300, a write to the second storage device (304) in diagram 330, a write to the fourth storage device (308) in diagram 330, and a write to the fifth storage device (310) in diagram 330.

In contrast, some other update processes would perform more read and/or write accesses to the storage system to make the same update. For example, another update process might read back all of the payload data (which would consume three reads), swap out the middle part of the payload data, encode the new payload data to obtain the new parity, write all of the new payload data to storage (which would consume three writes), and write all of the new parity to storage (which would consume two writes). These extra accesses consume network and/or storage resources and therefore the process of FIG. 1 is more efficient and attractive.

The following figures describes various aspects from FIG. 2 and FIG. 3 more formally and/or generally in flowcharts.

Figure 4:
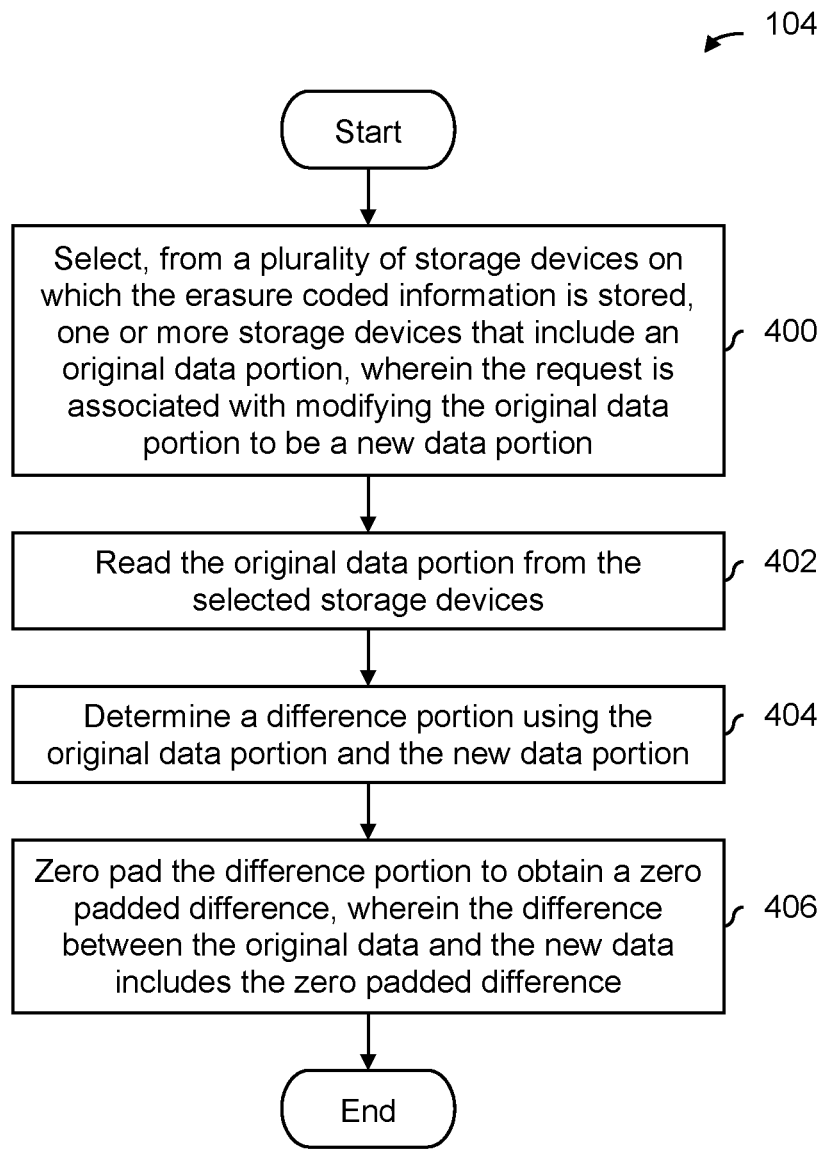
FIG. 4 is a flowchart illustrating an embodiment of a process to determine a difference between original data and new data.

FIG. 4 is a flowchart illustrating an embodiment of a process to determine a difference between original data and new data. In some embodiments, the process is used at step 104 in FIG. 1. In some embodiments, one of the storage devices in a distributed storage system is a primary unit and performs the processing described here.

At 400, one or more storage devices that include an original data portion are selected from a plurality of storage devices on which the erasure coded information is stored, wherein the request is associated with modifying the original data portion to be a new data portion. For example, in FIG. 3, the erasure coded information is stored on storage devices 302, 304, 306, 308, and 310. Of those storage devices, the second storage device (304) would be selected because it has the original data portion which is to be modified (see diagram 300).

In some embodiments, a change request (e.g., from an upper-level application or entity) includes an offset, address, and/or bit/character location within the payload data. For example, in FIG. 2, the identified offset or bit/character location may be "the second portion" or "bit/character locations 4-6." This offset or location may then be mapped to a particular storage device (e.g., the primary unit may track which specific storage devices within the distributed storage system store specific parts of the payload data and parity).

At 402, the original data portion is read from the selected storage devices. For example, in diagram 300 in FIG. 3, a value of DEF (314a) is read from the second storage device (304).

At 404, a difference portion is determined using the original data portion and the new data portion. See, for example, diagram 220 in FIG. 2. The new data portion (in that example, a value of XYZ) may be obtained from the change request and the original data portion (in that example, a value of DEF) may be obtained from the read at step 400. The difference portion is that is example is XYZ-DEF.

At 406, the difference portion is zero padded to obtain a zero padded difference, wherein the difference between the original data and the new data includes the zero padded difference. See, for example, the example difference portion (222) and zero padded difference (224) shown in diagram 220 in FIG. 2. In the context of FIG. 1, in some embodiments the zero padded difference is what is output as the difference between the original data and the new data at step 104 and what is input to an erasure encoder at step 106.

Figure 5:
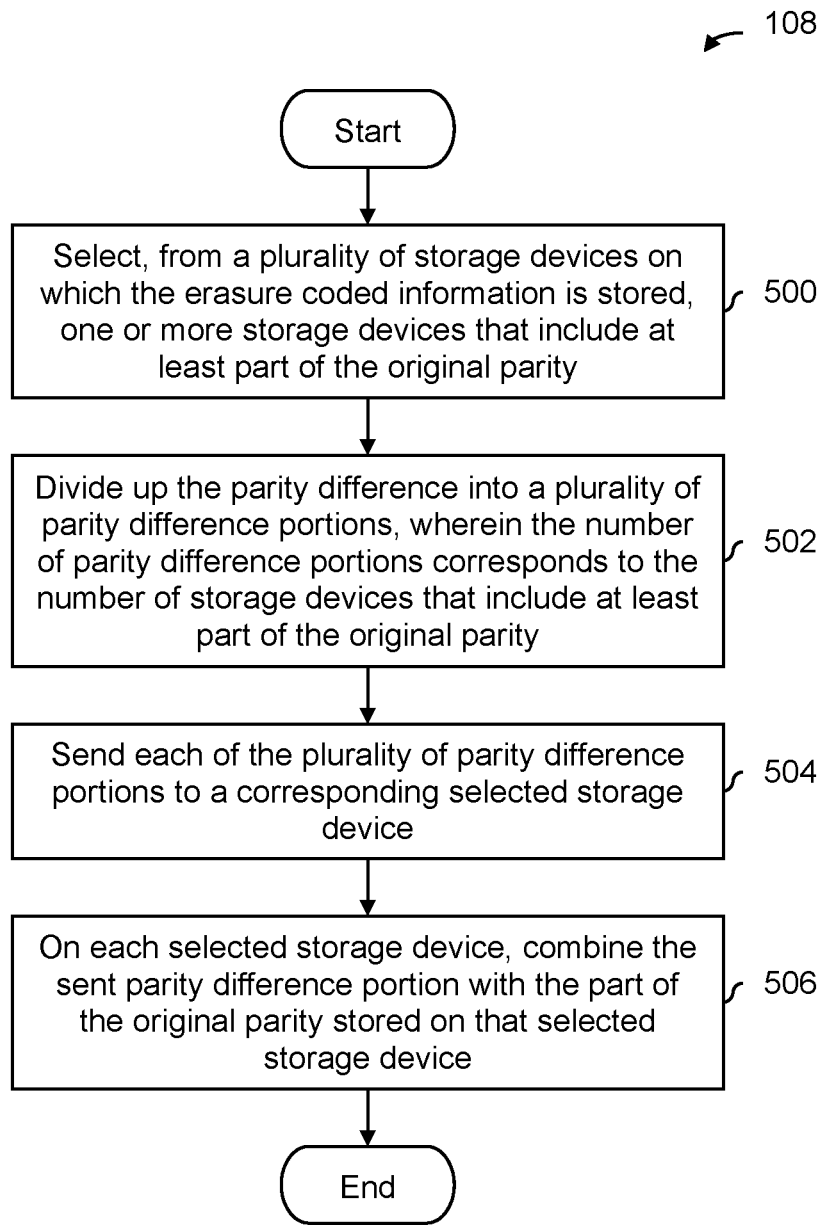
FIG. 5 is a flowchart illustrating an embodiment of a process to update original parity using a parity difference.

FIG. 5 is a flowchart illustrating an embodiment of a process to update original parity using a parity difference. In some embodiments, the process is used at step 108 in FIG. 1. In some embodiments, the process of FIG. 5 is performed in combination with the process of FIG. 4. In some embodiments, the process is performed by a primary unit in a distributed storage system.

At 500, one or more storage devices that include at least part of the original parity are selected from a plurality of storage devices on which the erasure coded information is stored. For example, in FIG. 3, the erasure coded information is stored on storage devices 302, 304, 306, 308, and 310. Of those storage devices, the fourth storage device (308) and fifth storage device (310) would be selected because they contain the original parity (see diagram 300).

At 502, the parity difference is divided up into a plurality of parity difference portions, wherein the number of parity difference portions corresponds to the number of storage devices that include at least part of the original parity. See diagram 220 in FIG. 2. The parity difference (226) is divided up into two parts (228 and 230) with the demarcation indicated by the dashed line.

At 504, each of the plurality of parity difference portions is sent to a corresponding selected storage device. For example, in FIG. 3, the first half of the parity difference (i.e., ΔP1) would be sent to the fourth storage device (308) and the second half of the parity difference (i.e., ΔP2) would be sent to the fifth storage device (310).

At 506, on each selected storage device, the sent parity difference portion is combined with the part of the original parity stored on that selected storage device. For example, in diagram 330 in FIG. 3, ΔP1 is combined with 123 (e.g., using a bit-wise exclusive OR operation) and the result is stored on the fourth storage device (308); and ΔP2 is combined with 456 (e.g., using a bit-wise exclusive OR operation) and the result is stored on the fifth storage device (310).

In some embodiments, a storage device in a distributed storage system includes hardware which is specially configured to perform the updates described herein (e.g., at step 108 in FIG. 1). The following figure shows one example of this.

Figure 6:
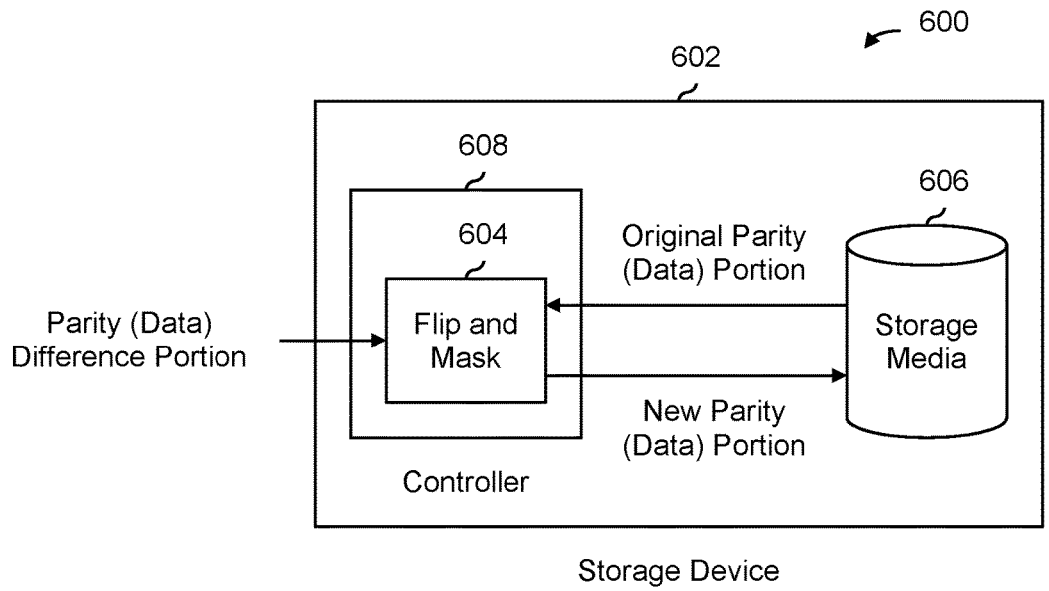
FIG. 6 is a diagram illustrating an embodiment of a storage device with a flip-and-mask block co-located with storage media.
Figure 6:
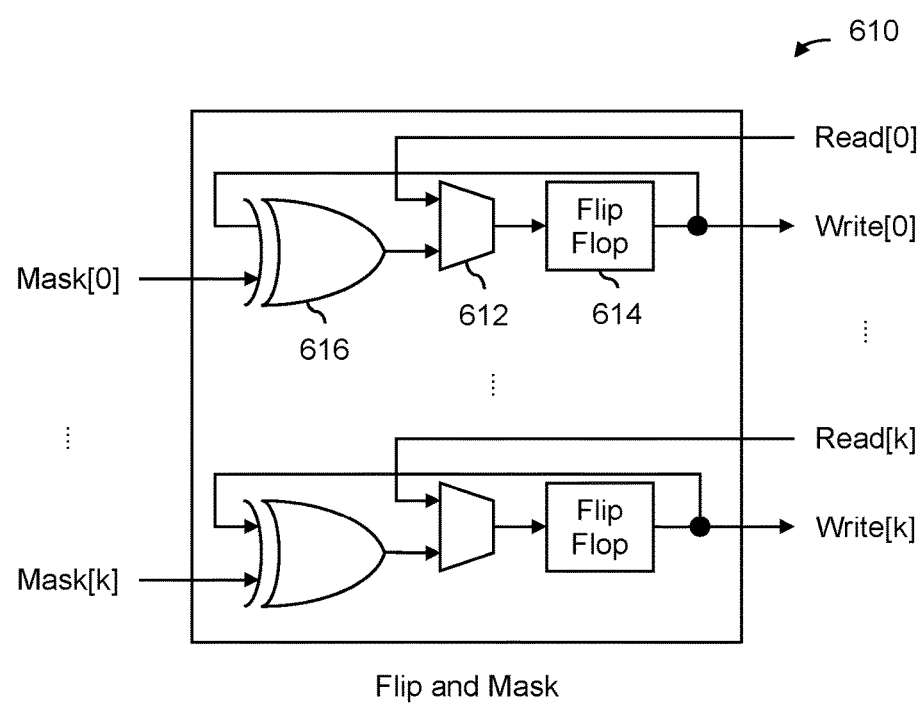

FIG. 6 is a diagram illustrating an embodiment of a storage device with a flip-and-mask block co-located with storage media. In some embodiments, the storage devices in FIG. 3 are implemented as storage device 602 and/or storage device 602 is used to update the original parity at step 108 in FIG. 1.

Diagram 600 shows an example of a storage device (602) with a flip-and-mask block (604). In some embodiments, the controller (608) which includes the flip-and-mask block is implemented in hardware for faster performance. The flip-and-mask block (generally speaking) selectively flips bits in a bit sequence according to a mask. Storage device 602 includes storage media (606) on which payload data and/or parity information is stored. To illustrate how the flip-and-mask block is used, consider the example where a part of the parity is stored on the storage media (606) and that piece of parity (i.e., an original parity portion) is being updated. The original parity portion is read from storage media (606) and passed to the flip-and-mask block (604) in the controller (608). For example, on the fourth storage device (308) in FIG. 3, the original parity portion 123 would be read. Note that the original parity portion being read does not leave the storage device (in this case, storage device 308 in FIG. 3) and would not need to be sent over the network or an external connection to other storage devices.

Returning to diagram 600 in FIG. 6, the flip-and-mask block (604) also inputs the parity difference portion. To continue the example where the original parity portion 123 is being updated, the first half of the parity difference (i.e., $\Delta P1$) is also input to the flip-and-mask (604) block. Block 604 is referred to as a flip-and-mask blocks because the parity (data) difference portion acts like a mask which describes which bits in the original parity (data) portion to flip. This is described in more detail below.

Diagram 610 shows a detailed view of the exemplary flip-and-mask block. In this example, each bit that is read from the storage media (e.g., storage media 606 in diagram 600) is processed by a corresponding group of gates comprising a multiplexer, a flip flop, and an exclusive OR (XOR) gate. For example, suppose the original parity portion comprising a value of 123 is read from the storage media. The zero bit of the original parity portion (i.e., read[0]) is first passed to multiplexer 612. To preserve the readability of the figure, the select signals or lines to the multiplexers are not shown. When reading from the storage media, multiplexer 612 is configured so that read[0] is output by multiplexer 612.

The output of multiplexer 612 is fed to the input (e.g., the D pin) of flip flop 614. Again to preserve the readability of the figure, the clock signals or lines to the flip flops are not shown. Flip flop 614 is clocked with read[0] at the input of the flip flop, such that the output of the flip flop (e.g., the Q pin) outputs the read[0] value. In this example, the flip flop buffers the read value (e.g., while the read value propagates through the multiplexers and XOR gates) and/or prevents transient signals from being written back to the storage media.

The output of flip flop 614 is passed back to the storage media as write[0] and is also passed to XOR 616. XOR 616 combines the output of flip flop 614 (in the current state, read[0]) with the zero bit of the mask (i.e., mask[0]). The mask is the parity difference portion and this example mask[0] would be the zero bit of the first half of the parity difference (i.e., $\Delta P1[0]$). If $\Delta P1[0]=1$, then read[0] (i.e., 123[0]) will be flipped (e.g., 0→1 or 1→0). If $\Delta P1[0]=0$, then read[0] will remain the same. For this reason, the parity difference portion is referred to as a mask, since it acts like a mask and specifies what bits in the read data (i.e., the original parity portion) to flip.

The output of XOR 616 is passed to the second input of multiplexer 612. The select signal is switched so that the output of XOR 616 is output by multiplexer 612 and passed to the input of flip flop 614. The flip flop is then clocked so that the output of the flip flop is the value of XOR(mask[0], read[0]). This value is then written back to the storage media. Processing for the other bits (i.e., bits 1-k) is the same as for bit 0.

Using a storage device which is configured as storage device 602 is (i.e., with a flip-and-mask block co-located with storage media) allows information stored in storage media to be updated quickly using a parity difference. In some embodiments, the exemplary storage device (602) is used to update payload data. For example, the difference portion (222) in FIG. 2 (i.e., XYZ-DEF) may be sent over the network in FIG. 3 to the second storage device (304) where the difference portion (i.e., XYZ-DEF) is used to mask and flip the original data portion (i.e., DEF) to become the new data portion (i.e., XYZ).

In the examples described above, the portion of the payload data being modified is a relatively small part of the payload data (e.g., kilobytes of gigabytes). In some cases, a larger portion of the payload data is updated. The following figure describes a process which decides whether to perform the update process of FIG. 1 (e.g., beginning at step 104) or some other update process depending upon how much of the original payload data is to be modified.

Figure 7:
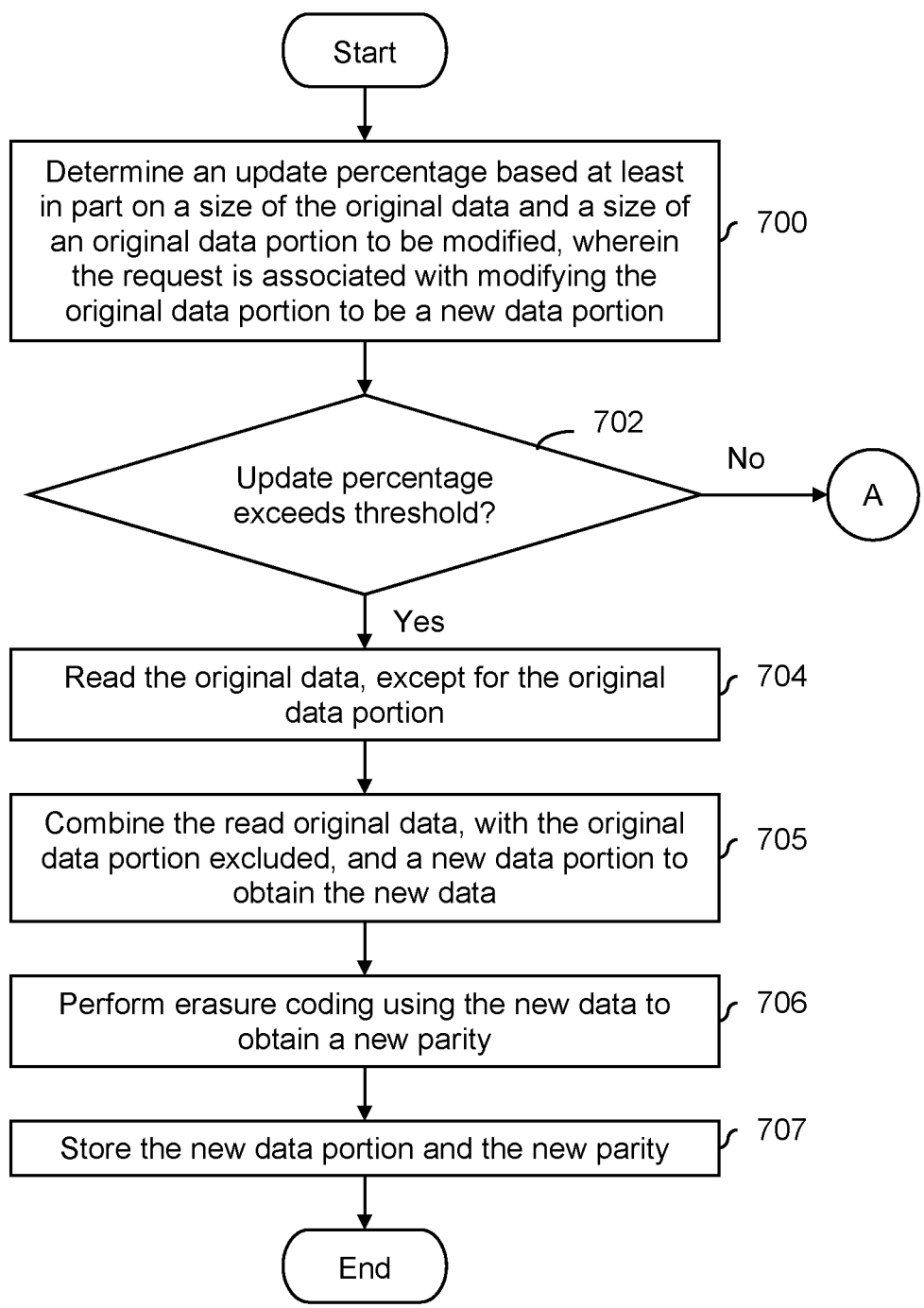
FIG. 7 is a flowchart illustrating an embodiment of a process to select an update process using an update percentage.

FIG. 7 is a flowchart illustrating an embodiment of a process to select an update process using an update percentage. In various embodiments, the process of FIG. 7 may be performed in combination with any of the previously described processes. In some embodiments, the process of FIG. 7 is performed by a primary drive.

At 700, an update percentage is determined based at least in part on a size of the original data and a size of an original data portion to be modified, wherein the request is associated with modifying the original data portion to be a new data portion. For example, in FIG. 2, 3 characters out of the 9 total characters are to be modified, so the update percentage would be 33%.

At 702, it is determined if the update percentage exceeds a threshold. For example, the update threshold may be on the order of 45%. If it is determined at step 702 that the threshold is not exceeded, then the update process of FIG. 1 (e.g., from step 104 onwards) is performed. For example, the benefits associated with step 104 onwards may be more pronounced when a relatively small portion of the payload data is being modified. With a larger update percentage, there may not be as much of a benefit and so a different update process is performed.

If it is determined at step 702 that the threshold is exceeded, then the update process described in steps 704-707 is performed. The update process shown in steps 704-707 is merely exemplary and any other alternative update process may be used.

At 704, the original data, except for the original data portion to be modified, is read. For example, in FIG. 3, the first original data portion (312) and the third original data portion (316) would be read from the first storage device (302) and the third storage device (306), respectively.

At 705, the read original data, with the original data portion excluded, and a new data portion are combined to obtain the new data. To continue the example from above, the data portions ABC, XYZ, and GHI would be concatenated together to form a single piece of new data (i.e., ABCXYZGHI). The new data portion (in this example, XYZ) may be obtained from the request which is received at step 102 in FIG. 1.

At 706, erasure coding is performed using the new data to obtain a new parity. To continue the example from above, ABCXYZGHI would be input to an encoder. The parity which is output is the new parity (246) shown in FIG. 2.

At 707, the new data portion and the new parity are stored. For example, XYZ would be written to the second storage device (304) in FIG. 3, (123+ΔP1) would be written to the fourth storage device (308), and (456+ΔP2) would be written to the fifth storage device (310).

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
   a processor; and
   a memory coupled with the processor, wherein the memory is configured to provide the processor with instructions which when executed cause the processor to:
   receive a request associated with modifying the original data to be new data;
   determine a difference between the original data and the new data;
   perform erasure coding using the difference between the original data and the new data to obtain a parity difference; and
   send, to a storage device which includes storage media on which an original parity is located, the parity difference, wherein:
      the storage device further includes hardware co-located with the storage media; and
      the hardware is configured to update the original parity using the parity difference without sending the original parity over a network connection, including by:
         receiving the original parity from the co-located storage media;
         receiving the parity difference;
         combining the original parity and the parity difference to obtain a combined original parity and parity difference; and
         sending the combined original parity and parity difference to the co-located storage media for storage.

2. The system recited in claim 1, wherein to determine the difference between the original data and the new data includes to:
   select, from a plurality of storage devices on which the erasure coded information is stored, one or more storage devices that include an original data portion, wherein the request is associated with modifying the original data portion to be a new data portion;
   read the original data portion from the selected storage devices;
   determine a difference portion using the original data portion and the new data portion; and
   zero pad the difference portion to obtain a zero padded difference, wherein the difference between the original data and the new data includes the zero padded difference.

3. The system recited in claim 1, wherein to update the original parity includes to:
   select, from a plurality of storage devices on which the erasure coded information is stored, one or more storage devices that include at least part of the original parity;
   divide up the parity difference into a plurality of parity difference portions, wherein the number of parity difference portions corresponds to the number of storage devices that include at least part of the original parity;
   send each of the plurality of parity difference portions to a corresponding selected storage device; and
   on each selected storage device, combine the sent parity difference portion with the part of the original parity stored on that selected storage device.

4. The system recited in claim 1, wherein the hardware co-located with the storage media includes a flip-and-mask block co-located with the storage media.

5. The system recited in claim 1, wherein the memory is further configured to provide the processor with instructions which when executed cause the processor to:
   determine an update percentage based at least in part on a size of the original data and a size of an original data portion to be modified, wherein the request is associated with modifying the original data portion to be a new data portion;
   determine if the update percentage exceeds a threshold; and
   in the event it is determined that the update percentage does not exceed the threshold, perform the steps of determining the difference between the original data and the new data, perform erasure coding using the difference, and update the original parity using the parity difference.

6. The system recited in claim 1, wherein the memory is further configured to provide the processor with instructions which when executed cause the processor to:
   determine an update percentage based at least in part on a size of the original data and a size of an original data portion to be modified, wherein the request is associated with modifying the original data portion to be a new data portion;
   determine if the update percentage exceeds a threshold;
   in the event it is determined that the update percentage does not exceed the threshold:
   determine the difference;
   perform erasure coding using the difference; and
   update the original parity using the parity difference; and
   in the event it is determined that the update percentage does exceed the threshold:
   read the original data, except for the original data portion;
   combine the read original data, with the original data portion excluded, and a new data portion to obtain the new data;
   perform erasure coding using the new data to obtain a new parity; and
   store the new data portion and the new parity.

7. A system, comprising:
   a processor which is configured to:
   receive a request associated with modifying the original data to be new data;
   determine a difference between the original data and the new data;

perform erasure coding using the difference between the original data and the new data to obtain a parity difference; and send, to a storage device which includes storage media on which an original parity is located, the parity difference; and the storage device which further includes hardware co-located with the storage media, wherein:

the hardware is configured to update the original parity using the parity difference without sending the original parity over a network connection, including by:
receiving the original parity from the co-located storage media;
receiving the parity difference;
combining the original parity and the parity difference to obtain a combined original parity and parity difference; and
sending the combined original parity and parity difference to the co-located storage media for storage; and the hardware includes a flip-and-mask block.

8. A method, comprising:

receiving a request associated with modifying the original data to be new data;

determining a difference between the original data and the new data;

performing erasure coding using the difference between the original data and the new data to obtain a parity difference; and sending, to a storage device which includes storage media on which an original parity is located, the parity difference, wherein:

the storage device further includes hardware co-located with the storage media; and the hardware is configured to update the original parity using the parity difference without sending the original parity over a network connection, including by:
receiving the original parity from the co-located storage media;
receiving the parity difference;
combining the original parity and the parity difference to obtain a combined original parity and parity difference; and
sending the combined original parity and parity difference to the co-located storage media for storage.

9. The method recited in claim 8, wherein determining the difference between the original data and the new data includes:

selecting, from a plurality of storage devices on which the erasure coded information is stored, one or more storage devices that include an original data portion, wherein the request is associated with modifying the original data portion to be a new data portion;

reading the original data portion from the selected storage devices;

determining a difference portion using the original data portion and the new data portion; and zero padding the difference portion to obtain a zero padded difference, wherein the difference between the original data and the new data includes the zero padded difference.

10. The method recited in claim 8, wherein updating the original parity includes:

selecting, from a plurality of storage devices on which the erasure coded information is stored, one or more storage devices that include at least part of the original parity;

dividing up the parity difference into a plurality of parity difference portions, wherein the number of parity difference portions corresponds to the number of storage devices that include at least part of the original parity;

sending each of the plurality of parity difference portions to a corresponding selected storage device; and on each selected storage device, combining the sent parity difference portion with the part of the original parity stored on that selected storage device.

11. The method recited in claim 8, wherein the hardware co-located with the storage media includes a flip-and-mask block co-located with the storage media.

12. The method recited in claim 8 further comprising:

determining an update percentage based at least in part on a size of the original data and a size of an original data portion to be modified, wherein the request is associated with modifying the original data portion to be a new data portion;

determining if the update percentage exceeds a threshold; and in the event it is determined that the update percentage does not exceed the threshold, perform the steps of determining the difference between the original data and the new data, perform erasure coding using the difference, and update the original parity using the parity difference.

13. The method recited in claim 8 further comprising:

determining an update percentage based at least in part on a size of the original data and a size of an original data portion to be modified, wherein the request is associated with modifying the original data portion to be a new data portion;

determining if the update percentage exceeds a threshold;

in the event it is determined that the update percentage does not exceed the threshold:
determining the difference;
performing erasure coding using the difference; and
updating the original parity using the parity difference; and in the event it is determined that the update percentage does exceed the threshold:
reading the original data, except for the original data portion;
combining the read original data, with the original data portion excluded, and a new data portion to obtain the new data;
performing erasure coding using the new data to obtain a new parity; and
storing the new data portion and the new parity.

14. A computer program product, the computer program product being embodied in a non-transitory computer readable storage medium and comprising computer instructions for:

receiving a request associated with modifying the original data to be new data;

determining a difference between the original data and the new data;

performing erasure coding using the difference between the original data and the new data to obtain a parity difference; and sending, to a storage device which includes storage media on which an original parity is located, the parity difference, wherein:

the storage device further includes hardware co-located with the storage media; and the hardware is configured to update the original parity using the parity difference without sending the original parity over a network connection, including by:
receiving the original parity from the co-located storage media;
receiving the parity difference;
combining the original parity and the parity difference to obtain a combined original parity and parity difference; and
sending the combined original parity and parity difference to the co-located storage media for storage.

15. The computer program product recited in claim 14, wherein the computer instructions for determining the difference between the original data and the new data include computer instructions for:
selecting, from a plurality of storage devices on which the erasure coded information is stored, one or more storage devices that include an original data portion, wherein the request is associated with modifying the original data portion to be a new data portion;
reading the original data portion from the selected storage devices;
determining a difference portion using the original data portion and the new data portion; and
zero padding the difference portion to obtain a zero padded difference, wherein the difference between the original data and the new data includes the zero padded difference.

16. The computer program product recited in claim 14, wherein the computer instructions for updating the original parity include computer instructions for:
selecting, from a plurality of storage devices on which the erasure coded information is stored, one or more storage devices that include at least part of the original parity;
dividing up the parity difference into a plurality of parity difference portions, wherein the number of parity difference portions corresponds to the number of storage devices that include at least part of the original parity;
sending each of the plurality of parity difference portions to a corresponding selected storage device; and
on each selected storage device, combining the sent parity difference portion with the part of the original parity stored on that selected storage device.

17. The computer program product recited in claim 14, wherein the hardware co-located with the storage media includes a flip-and-mask block co-located with the storage media.

18. The computer program product recited in claim 14 further comprising computer instructions for:
determining an update percentage based at least in part on a size of the original data and a size of an original data portion to be modified, wherein the request is associated with modifying the original data portion to be a new data portion;
determining if the update percentage exceeds a threshold; and
in the event it is determined that the update percentage does not exceed the threshold, perform the steps of determining the difference between the original data and the new data, perform erasure coding using the difference, and update the original parity using the parity difference.

19. The computer program product recited in claim 14 further comprising computer instructions for:
determining an update percentage based at least in part on a size of the original data and a size of an original data portion to be modified, wherein the request is associated with modifying the original data portion to be a new data portion;
determining if the update percentage exceeds a threshold;
in the event it is determined that the update percentage does not exceed the threshold:
determining the difference;
performing erasure coding using the difference; and
updating the original parity using the parity difference; and
in the event it is determined that the update percentage does exceed the threshold:
reading the original data, except for the original data portion;
combining the read original data, with the original data portion excluded, and a new data portion to obtain the new data;
performing erasure coding using the new data to obtain a new parity; and
storing the new data portion and the new parity.

* * * * *